US010355662B2

(12) United States Patent
Backes et al.

(10) Patent No.: US 10,355,662 B2
(45) Date of Patent: Jul. 16, 2019

(54) IMPEDANCE MATCHING USING TUNABLE ELEMENTS

(71) Applicant: Honeywell International Inc., Morris Plains, NJ (US)

(72) Inventors: Glen Backes, Maple Grove, MN (US); Lisa Lust, Minneapolis, MN (US); Kelly Muldoon, Minneapolis, MN (US); Doug Carlson, Woodbury, MN (US)

(73) Assignee: Honeywell International Inc., Morris Plains, NJ (US)

( * ) Notice: Subject to any disclaimer, the term of this patent is extended or adjusted under 35 U.S.C. 154(b) by 294 days.

(21) Appl. No.: 15/370,708

(22) Filed: Dec. 6, 2016

(65) Prior Publication Data

US 2018/0159222 A1   Jun. 7, 2018

(51) Int. Cl.
*H03H 7/40* (2006.01)
*H03H 7/38* (2006.01)
*H01Q 5/335* (2015.01)

(52) U.S. Cl.
CPC .............. *H03H 7/40* (2013.01); *H01Q 5/335* (2015.01); *H03H 7/38* (2013.01); *H03H 2210/025* (2013.01)

(58) Field of Classification Search
CPC combination set(s) only.
See application file for complete search history.

(56) References Cited

U.S. PATENT DOCUMENTS

| 4,015,223 | A | | 3/1977 | Cheze |
| 5,778,308 | A | * | 7/1998 | Sroka ........................ H03H 7/40 333/17.3 |
| 6,414,562 | B1 | | 7/2002 | Bouisse et al. |
| 8,405,467 | B2 | | 3/2013 | He |
| 2007/0187804 | A1 | | 8/2007 | Ei et al. |
| 2007/0197180 | A1 | | 8/2007 | Mckinzie, III et al. |
| 2011/0043282 | A1 | | 2/2011 | Drogi et al. |
| 2013/0187712 | A1 | * | 7/2013 | Cabanillas ............... H03H 7/40 330/192 |
| 2013/0328734 | A1 | | 12/2013 | Thind |

(Continued)

FOREIGN PATENT DOCUMENTS

| EP | 1843477 A2 | 10/2007 |
| WO | 2010141774 | 12/2010 |
| WO | WO-2013/185094 A1 | 12/2013 |

OTHER PUBLICATIONS

"European Application Serial No. 17202361.6, Extended European Search Report dated Sep. 7, 2018", 20 pgs.

(Continued)

*Primary Examiner* — Zhitong Chen
(74) *Attorney, Agent, or Firm* — Schwegman Lundberg & Woessner, P.A.

(57) ABSTRACT

Generally discussed herein are techniques, software, apparatuses, and systems configured for impedance matching. An impedance matching tuner can include a first tunable capacitor arranged in series with a radio frequency (RF) input, a second tunable capacitor arranged in shunt with the RF input, a third tunable capacitor and a first inductance device arranged in parallel with each other and in shunt with the RF input, and a fourth tunable capacitor and a second inductance device arranged in parallel with each other and in series with the RF input.

15 Claims, 7 Drawing Sheets

(56) References Cited

U.S. PATENT DOCUMENTS

2014/0104132 A1\* 4/2014 Bakalski ................ H03H 7/38
  343/861
2015/0236728 A1\* 8/2015 Suzuki ................ H04B 1/0458
  455/127.1
2017/0179996 A1\* 6/2017 Knepper ................ H04B 1/40
2017/0244432 A1\* 8/2017 Ranta ................ H04B 1/0067
2017/0346178 A1\* 11/2017 Shi ...................... H04B 17/102

OTHER PUBLICATIONS

"European Application Serial No. 17202361.6, Office Action dated May 2, 2018", 8 pgs.

\* cited by examiner

IMPEDANCE MATCHING USING TUNABLE ELEMENTS

BACKGROUND

An impedance mismatch between components can affect electrical characteristics of an electromagnetic signal (e.g., magnitude, phase, or the like). Impedance mismatch can cause data to be transmitted at a different magnitude or phase than what is desired or expected. Impedance matching networks attempt to match an impedance of an input signal or an output impedance of a signal source. The better the impedance match, the more efficiently signal power is transferred to or received from a component.

SUMMARY

In one or more embodiments, an impedance matching tuner can include a first tunable capacitor arranged in series with a radio frequency (RF) input, a second tunable capacitor arranged in shunt with the RF input, a third tunable capacitor and a first inductance device arranged in parallel with each other and in shunt with the RF input, and a fourth tunable capacitor and a second inductance device arranged in parallel with each other and in series with the RF input.

In one or more embodiments, a system can include an antenna, a hardware processor electrically coupled to the antenna, a first amplitude and phase detector electrically coupled between the antenna and the processor to receive at least a portion of a forward signal provided to the antenna and determine an amplitude and phase of the forward signal, a second amplitude and phase detector electrically coupled between the antenna and the processor to receive at least a portion of a reflected signal from the antenna and determine an amplitude and phase of the reflected signal the reflected signal is a portion of the forward signal, and an impedance matching tuner electrically connected between the antenna and the first and second detectors, the impedance matching tuner including one or more tunable capacitors and one or more inductance devices, the one or more tunable capacitors having capacitances that are set by the hardware processor based on the amplitudes and phases determined by the first and second amplitude and phase detectors.

In one or more embodiments, a method can include providing, by processing circuitry, a radio frequency (RF) input signal to an output of a first device, receiving, by a first path of bi-directional coupler coupled between the output and the processing circuitry, a first portion of the RF input signal, receiving, by a second path of the bi-directional coupler, a second portion of the RF input signal reflected from the output, determining, by a first amplitude and phase detector coupled between the processing circuitry and the bi-directional coupler, a magnitude and angle of the first portion of the RF input signal determining, by a second amplitude and phase detector coupled between the processing circuitry and the bi-directional coupler, a magnitude and angle of the second portion of the RF input signal, determining, by the processing circuitry, a magnitude and angle of a reflection coefficient associated with the RF signal reflected from the output, and providing, by the processing circuitry, respective voltages or values to each of a plurality of tunable capacitors of an impedance matching tuner coupled between the bi-directional coupler and the output, the respective voltages or values determined based on the determined magnitude and angle of the reflection coefficient.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

While embodiments of this disclosure can take many different forms, specific embodiments thereof are shown in the drawings, and will be described herein in detail with the understanding that the present disclosure is to be considered as embodiments of the principles of the disclosure, as well as the best mode of practicing the same, and is not intended to limit the disclosure to the specific embodiments illustrated.

Impedance mismatch between devices causes power transfer losses. Impedance mismatch can occur from a wire (e.g., insulated wire, trace, or the like), component, or external environment interacting with a signal and altering a phase of the signal. An impedance mismatch causes a portion of the signal to be reflected away from a receiving or transmitting component. Impedance matching can be important in devices that use an antenna to receive and/or transmit signals.

Overcoming radio frequency (RF) link budget constraints can be challenging, especially in operation of wireless devices. Most RF devices are susceptible to antenna performance degradation due to the proximity of a hand, head, or other object(s) which may be held close to a radiating antenna. Such antenna performance degradation can limit the effective range of communication, and in the case of devices with automatic level control, limit battery life due to excessive power draw of a transmit power amplifier (PA). The performance degradation can be due, at least in part, to the antenna becoming detuned (i.e. an impedance of the antenna not sufficiently matching an impedance of the external environment). This detuning effect is particularly pronounced when using electrically small, high Q antennas that have a narrow bandwidth. The amount of detuning is typically highly arbitrary and it is difficult to tune the impedance in the development/production process due to the wide range of environmental conditions and corresponding detuning variance.

Another problem is that damaging voltage levels incident to the transmit PA can occur as a result of a wave reflected from a de-tuned antenna. Electrically small antennas have inherently low gain, and coupling into arbitrarily larger structures can help improve electrical performance of the radiating portion of the antenna and improve communication link loss. Discussed herein are systems, devices, and methods that can improve the ability to resist detuning of the antenna (e.g., a dipole or a monopole antenna). By automatically monitoring the response of an antenna, a correction signal can be applied to tunable elements which can counteract the effects of inadvertent loading.

An antenna can be sensitive to an electric field near (e.g., in the near-field of) the antenna. This electric field can be changed by objects in the vicinity of the antenna. For example, an electromagnetic field in the vicinity of an antenna can be affected by a hand, head, a surface, moisture, or other object or material in the vicinity of the antenna. This change in the electromagnetic field can cause an impedance mismatch between the antenna and the surrounding environment. The impedance mismatch can cause a portion of a signal to be transmitted by the antenna to be reflected, thus reducing the power of the transmitted signal. One or more embodiments discussed herein can help reduce the impedance mismatch and, as a result, can help increase an amplitude (e.g., power) of a transmitted signal.

One or more embodiments discussed herein can help improve the ability of the antenna (or other device) to resist detuning. By monitoring (e.g., automatically) a transmitted and/or reflected signal amplitude and/or phase, correction signals can be provided to a tunable element that can help counteract the effects of inadvertent loading. The correction signal can alter an impedance of the tunable element, such as to help match an impedance of a component to an impedance of the surrounding environment.

One or more embodiments discussed herein can help improve the RF communication link performance for output (e.g., transmitter) and input (e.g., receiver) devices of a variety of form factors. An improvement discussed allows for a wider variety of impedances that can be matched to the RF device. Through non-contact coupling, one or more embodiments allow close proximity arbitrarily large objects to be impedance matched to another device, such as to realize large radiating structures, such as to provide higher effective radiating output power. These structures can include AC power line infrastructure, metal pipes, wires, printed conductors, etc.

The methods, systems, and devices discussed herein can help allow virtually any impedance to be automatically matched to any other arbitrary impedance. This can apply to a transmitter matched to an antenna, a receiver matched to an antenna, or any type of RF circuit matched to any other RF circuit, all of which improves the RF link budget margin.

The electrical reflection impedance presented as the result of an improperly matched antenna (or other component or components) can be generally divided into four impedance zones, depending on the sign of the real and imaginary parts of the complex impedance. Each of the four zones has a specific circuit topology for impedance matching. The complex impedance can be measured, such as by using a bi-directional coupler to provide a reflected signal and a forward signal to processing circuitry (e.g., first and/or second phase and amplitude detectors). The reflected signal can be compared with the forward signal, and angle can be determined with such comparison.

Four tunable elements can be used for a full range of impedance matching. One circuit instantiation, starting from the antenna, is series inductance, shunt inductance, series capacitance, and finally shunt capacitance. Electrically tunable capacitors are readily available in the form of a varactor or a digitally tunable capacitor. Electrically tunable inductors are available as well. Alternatively, instead of a tunable inductor, a 45 degree transmission line can be placed in parallel with a varactor or digitally tunable capacitor, and a range of tunable inductive reactance is then realized by tuning the parallel varactor or digitally tunable capacitor.

Reference will now be made to the FIGS. to further describe details of embodiments of the disclosure.

Figure 1:
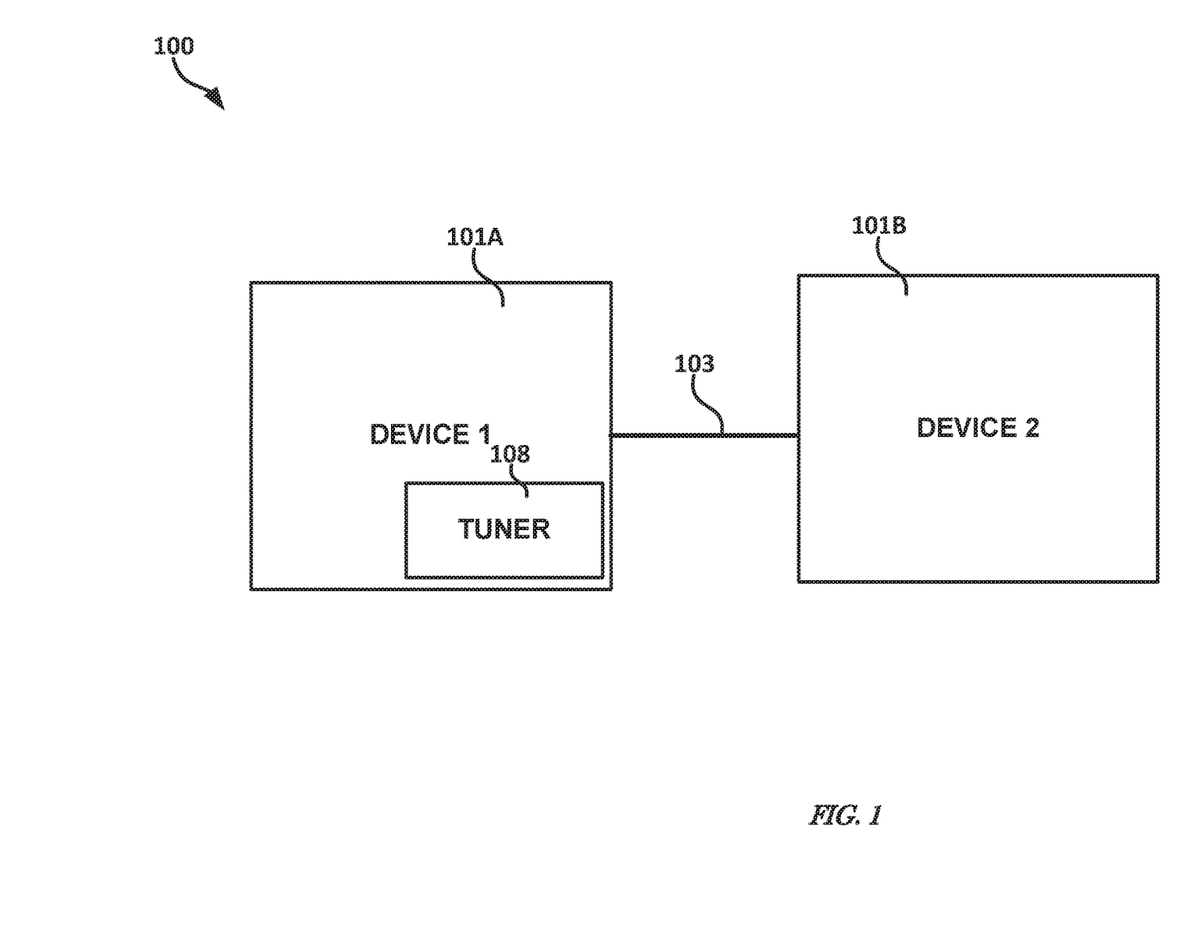
FIG. 1 illustrates, by way of example, a block diagram of an embodiment of system including an impedance matching tuner.

FIG. 1 illustrates, by way of example, a block diagram of an embodiment of a system 100 including an impedance tuner 108. The system 100 as illustrated includes a first device 101A communicatively coupled to a second device 101B through a wired or wireless connection 103. The device 101A-B can include one or more electric or electronic components, such as can include one or more transistors, capacitors, inductors, resistors, diodes, oscillators, antennas, radios, modulators, demodulators, amplifiers, voltage or current supplies or regulators, relays, switches, multiplexers, buffers, circulators, or the like.

The device 101A includes the tuner 108. The tuner 108 can include one or more capacitors (e.g., tunable capacitors, such as a varactor or a digitally tunable capacitor, or the like) and/or one or more inductance devices (e.g., a transmission line, a tunable inductor, or the like). Embodiments of circuitry that can be used in the tuner 108 are provided in FIGS. 3 and 4.

An impedance mismatch can exist between the first device 101A and the second device 101B. The tuner 108 can help reduce the impedance mismatch, such as to increase a power of a signal transmitted between the first and second devices 101A-B or by reducing a signal loss between the devices 101A-B, or both.

Figure 2:
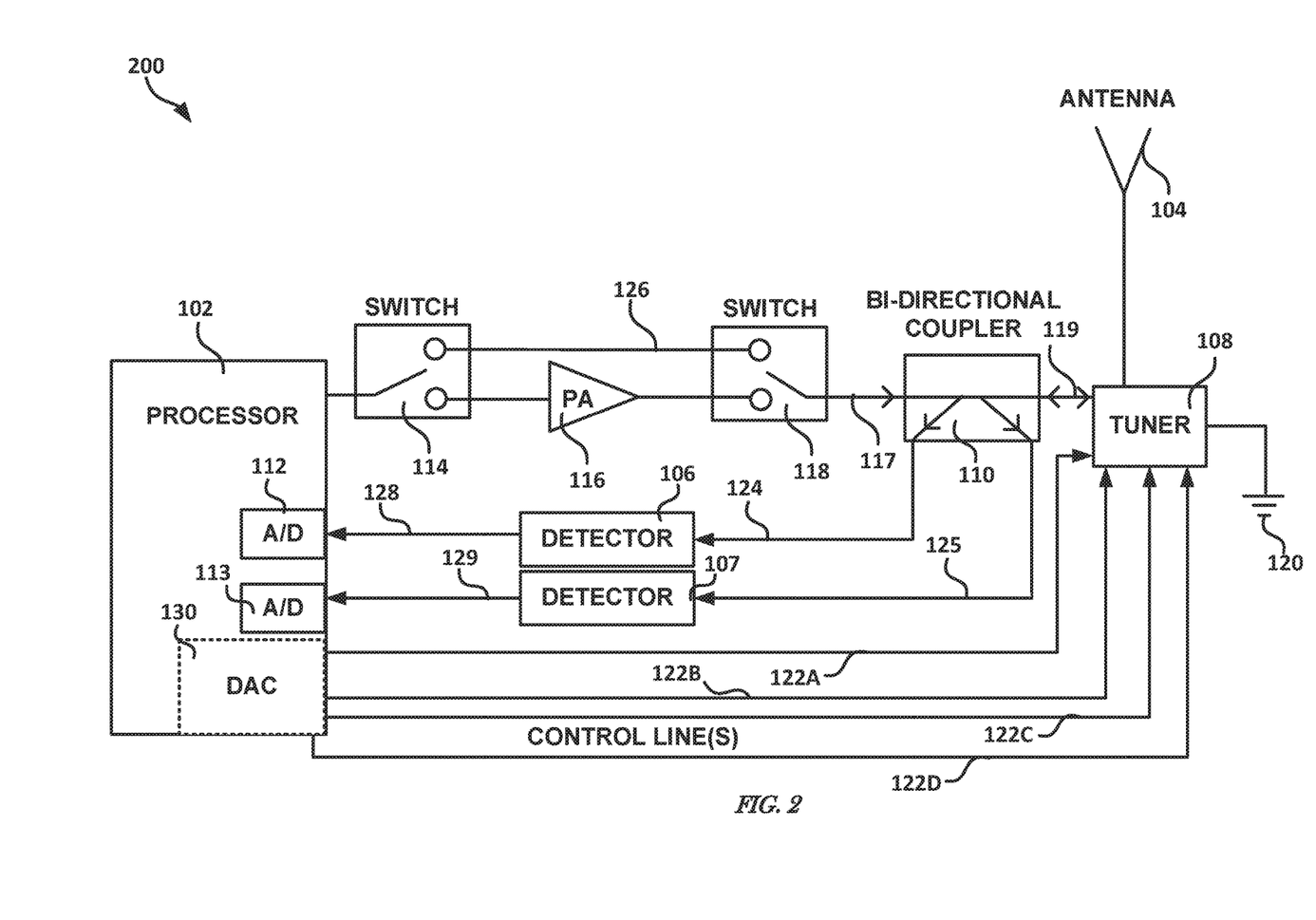
FIG. 2 illustrates, by way of example, a block diagram of an embodiment of a system that includes an impedance matching tuner coupled between a first device and an antenna.

FIG. 2 illustrates, by way of example, a block diagram of an embodiment of a system 200 that includes an impedance matching tuner 108 coupled to an antenna 104. The system 200 can be a part of a radio transmitter, receiver, or transceiver. The system 200 can be a part of a phone (e.g., a smartphone, cellular phone, or other phone), tablet, desktop computer, thermostat, or other device that includes a radio receiver, transmitter, or transceiver. The system 200 as illustrated includes a processor 102, an antenna 104, a plurality of detectors 106 and 107, and a tuner 108.

The processor 102 can be electrically coupled to the detector 106, the detector 107, the tuner 108, and/or a switch 114, such as in parallel. The detector 106 can be electrically coupled to the processor 102 through a connection 128. The detector 107 can be electrically coupled to the processor 102 through a connection 129. The detector 106 can be electrically coupled to a bi-directional coupler 110 through a connection 124. The detector 107 can be electrically coupled to the processor 102 through a connection 125.

The switch 114 can be electrically coupled, such as on alternative paths, to a power amplifier (PA) 116 and another switch 118. The switch 114 can be electrically coupled to the switch 118 through a bypass connection 126. The switch 118 can be electrically coupled to a low loss path of the bi-directional coupler 110 through an electrical connection 117. The bi-directional coupler 110 can be electrically coupled to the antenna 104 and the tuner 108, such as through the directional controller output connection 119. The processor 102 can be electrically coupled to the tuner 108, such as through control lines 122A, 122B, 122C, and/or 122D.

The processor 102 can include one or more microprocessors or electrical or electronic components (such as those previously discussed) arranged (e.g., programmed) to perform operations as discussed herein. The operations of the processor 102 can be implemented in one or more modules. The processor 102 can be electrically coupled to one or more switches 114 or 118. The switch 114 or 118 can include a single pull double throw (SPDT) type of switch or other switch. A multiplexer, transistor, or other switching type device can be used in place of the switch 114 or 118. The processor 102 can send a signal to the antenna 104, such as through the tuner 108, such as can be transmitted by the antenna 104. The signal can pass through the switch 114 to the radio frequency (RF) power amplifier (PA) 116. The PA 116 can boost the power of a signal, so as to help increase a range of a signal transmitted by the antenna 104. The processor 102 can control the position of the state of the switch 114 and 118, such as to determine the path of a signal from/to the processor 102.

The PA 116 can be electrically coupled between the switches 114 and 118, such as shown in FIG. 1. The output of the PA 116 can be input to the bi-directional coupler 110. The bi-directional coupler 110 can provide a low loss path for the amplified signal to be transmitted to the antenna 104. The antenna 104 can transmit the signal from the coupler 110.

If an impedance of the antenna 104 does not match an impedance of the environment the antenna 104 is transmitting in, a portion of the signal from the antenna 104 can be reflected back towards the bi-directional coupler 110. The tuner 108 can be a variable impedance device that can be adjusted to change the impedance of the antenna 104. The tuner 108 can be electrically coupled between the antenna 104 and a reference voltage, such as ground 120 as shown in FIG. 2. The tuner 108 can be adjusted by transmitting a digital word on the control line(s) 122A-D or transmitting a voltage on the control line(s). Different digital words or voltages can correspond to different impedance values of the tuner 108.

At least a portion of the signal reflected from the antenna 104 towards the hi-directional coupler 110 can travel through a reflected signal connection 124 towards the detector 106. The detector 106 can determine an amplitude and/or phase of a received signal (or a power if the received signal is passed through an impedance). The determined amplitude and/or phase can be an analog signal that is sent through the connection 128 to an analog to digital (A/D) converter 112. The ADC 112 can process the analog signal so as to convert the analog signal to a digital word representative of the amplitude and/or phase of the received signal. While FIG. 2 shows the ADC 112 as part of the processor 102, the ADC 112 can include a standalone chip or can be a part of the detector 106.

At least a portion of a forward signal from the processor 102 to the antenna 104 can travel through another path of the bi-directional coupler 110, such as to the connection 125. The portion of the forward signal can be provided to the detector 107. The detector 107 can determine an amplitude and/or phase of a received signal (or a power if the received signal is passed through an impedance). The determined amplitude and/or phase can be an analog signal that is sent through the connection 129 to the ADC 113. The ADC 113 can process the analog signal so as to convert the analog signal to a digital word representative of the amplitude and/or phase of the received signal. While FIG. 2 shows the ADC 113 as part of the processor 102, the ADC 113 can include a standalone chip or can be a part of the detector 107.

The antenna 104 can receive a signal, such as can be transmitted from a different antenna. The received signal can be directed to the bi-directional coupler 110. The majority of the signal received at the bi-directional coupler 110 can be transmitted to the switch 118 and through the bypass connection 126 and the switch 114 to the processor 102. The processor 102 can then interpret the signal from the bypass connection 126, such as to determine data (e.g., contents of a message) being transmitted by the different antenna.

To help reduce the impedance mismatch between the antenna 104 and the environment external to and/or near the antenna 104, the processor 102 can transmit a signal(s) to the tuner 108, such as through one or more control line(s) 122A-D, such as to set the tuner 108 to a tuner state. Each tuner state of the tuner 108 can correspond to a different impedance. For example, the tuner 108 can include a first impedance when the tuner is set to a first tuner state and a second, different impedance when the tuner is set to a second tuner state. By having a variable impedance, the tuner 108 can help in matching an impedance of the antenna 104 to an impedance of the surrounding environment. Examples of tuners 108 are provided in FIGS. 3 and 4.

The processor 102 can provide the tuner 108 with one or more signals, such as to set the tuner to a state. The tuner 108 can be set to a first state by the processor 102, a signal can be transmitted through the antenna 104, a portion of which is received at the detector 107, and a reflected signal from the antenna 104 can be received at the detector 106. This process can be repeated for one or more states of the tuner 108, such as to sweep the tuner 108 through multiple tuner states. The amplitude(s) of the reflected signal(s), as determined by the detector 106 and 107, can be compared (e.g., by the processor 102), such as to determine a minimum, maximum, or a specified amplitude and/or phase or power of a reflected signal. The processor 102 can then set the tuner 108 to the tuner state that corresponds to the minimum, maximum, or other specified amplitude and/or phase.

In the case of a reflected signal, in one or more embodiments, the processor 102 can determine the amplitude that is the smallest of all the reflected signals and set the tuner 108 to the value that corresponds to the smallest amplitude. This value of the tuner 108 can cause a power of the transmitted signal to be maximized in accord with the current circuit and operating conditions (e.g., environment external to the antenna 104 or the circuitry of the system 200).

Since the environment external to the antenna 104 can change, the maximum transmission power of the antenna 104 can change. Similarly, the state of the tuner 108 that corresponds to the maximum output power of the antenna 104 can change with the external environment as well. To help alleviate the effects of the changing environment, the operations for selecting the value for the tuner 108 can be done multiple times, which can be predetermined or dynamic. For example, if the reflected data over a period of time indicates that the antenna is in a static condition, such as a condition of the device sitting on a table or being mounted on a wall, then it can be unnecessary to perform the tuning operation(s) frequently. In one or more embodiments, the processor 102 can dynamically adapt and learn how often to perform the tuning operation(s), such as to find a new state of antenna adjustment. Such an embodiment can have the added benefit of reducing DC power consumption by limiting the number of A/D conversions that occur, while still increasing the power output of the antenna 104.

In one or more embodiments, the tuner 108 can include one or more varactors. In such embodiments, the processor 102 can include one or more digital to analog converters (DAC) 130. The DAC 130 converts a digital signal or word to an analog signal proportional to a value of the digital signal or word. In one or more embodiments, the tuner 108 can include one or more digitally tunable capacitors. In such embodiments, the DAC 130 is superfluous. Thus, the DAC 130 is optional.

In one or more embodiments, the operations of sweeping the tunable element(s) through the state(s) and setting the tunable element(s) to a value can be done periodically with relatively little time (e.g., fractions of a second to minutes) between sweeps. Such embodiments can be helpful for devices that are subject to external environments that change relatively often (e.g., phones, tablets, laptops, smart wearable devices, such as glasses or watches, or other devices).

In one or more embodiments, the operations of sweeping the tunable element(s) through the state(s) and setting the tunable element(s) to a value can be done periodically with a relatively large amount of time (e.g., hours, days, weeks, months, or years) between sweeps. Such embodiments can be helpful for devices that are subject to relatively static external environments (e.g., thermostats, desktop computers, smart monitors, smart televisions or video players, video game consoles, or other devices).

Note that other sweeping timeframes can be used, such as random time frames between sweeping, such as a user-initiated sweep or other. In one or more embodiments, an amplitude of a reflected or transmitted signal can be monitored and the tunable element(s) can be swept in response to determining the reflected or transmitted signal is greater than, less than, or equal to a predetermined threshold.

Figure 3:
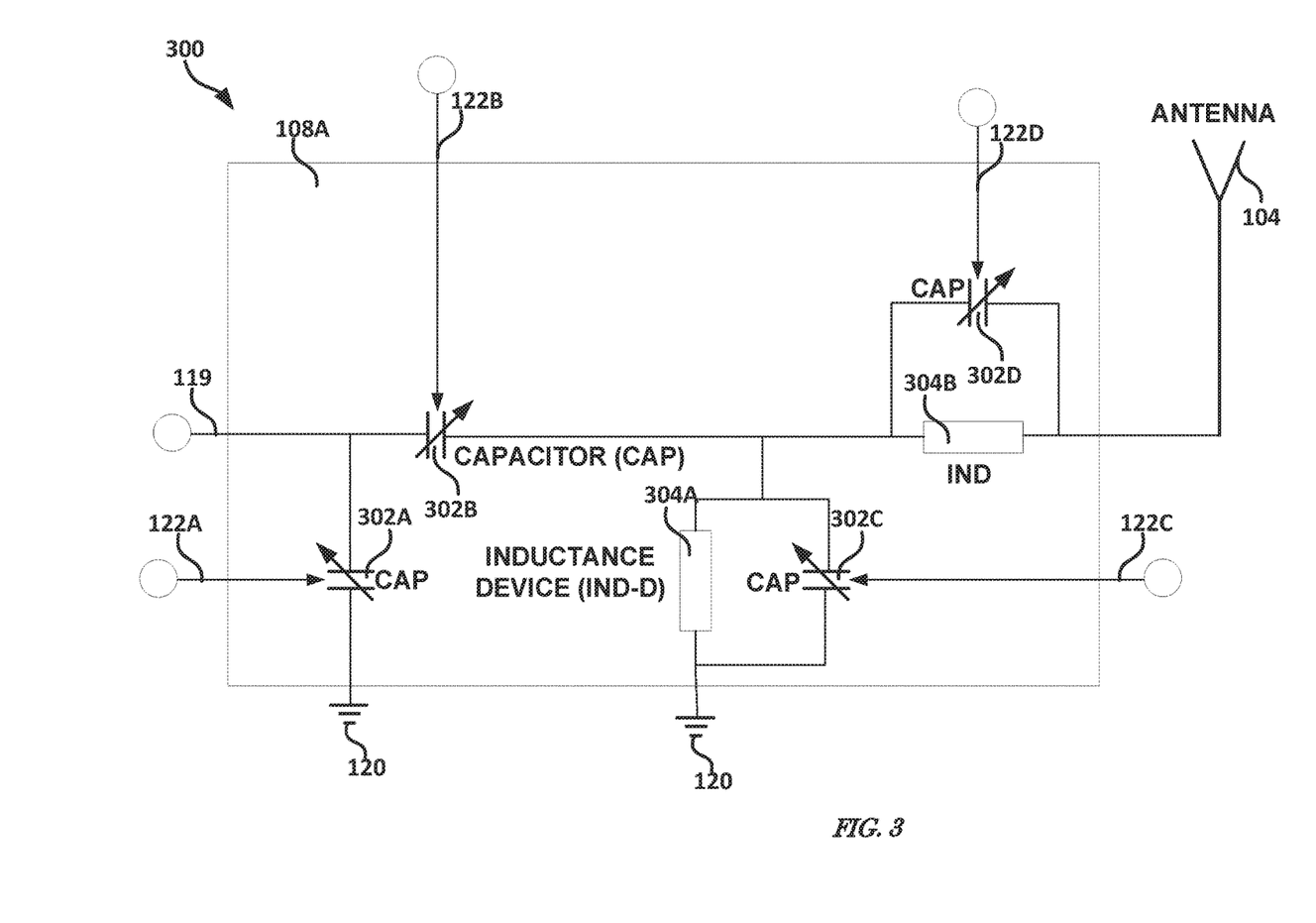
FIG. 3 illustrates, by way of example, a schematic diagram of an embodiment of an impedance matching tuner.

FIG. 3 illustrates, by way of example, a schematic diagram of an embodiment of a system 300 that is a portion of the system 200. The system 300 as illustrated includes a tuner 108A. Tuner 108A is a specific embodiment of the tuner 108. The tuner 108A as illustrated includes a plurality of tunable capacitors 302A, 302B. 302C, and 302D. The tunable capacitors 302A-D can include one or more digitally tunable capacitors or varactors. A varactor is an analog tunable capacitor. The capacitance value of a varactor is inversely proportional to the square root of a voltage of a signal incident on the varactor.

The tuner 108A as illustrated includes one or more inductance devices, such as can include an inductor (e.g., a tunable inductor) and/or a transmission line. A transmission line that includes a length that is one-eighth of a wavelength of a signal incident thereon can provide a 45 degree shift in phase. This forty-five degree shift can be adjusted by adjusting a value of the capacitor 302C-D in parallel with the inductance device 304A-B, respectively.

The capacitor 302A and 302C provide a shunt capacitance to a signal incident on the tuner 108A, such as on the connection 119. The capacitor 302B and 302D provide a series capacitance to a signal incident on the tuner 108A. The inductance device 304A provides a shunt inductance to a signal incident on the tuner 108A. The inductance device 304B provides a series inductance to a signal incident on the tuner 108A.

Using the tuner 108A, an impedance in any region of the Smith chart (see FIG. 5) can be matched. Signals can be provided to the capacitors using the control lines 122A-D, respectively. In embodiments in which the capacitors 302A-D are digitally tunable capacitors, the signals on the control lines 122A-D can be digital values or words. In embodiments in which the capacitors 302A-D are varactors, the signals on the control lines 122A-D can be analog voltages.

By adjusting the signals on the control lines 122A-D can be adjusted by the processor 102, such as to adjust the impedance of the tuner 108A. By adjusting the amplitude or value on the control lines 122A-D, an impedance in any impedance region in the Smith chart (see FIG. 5) can be realized.

Figure 4:
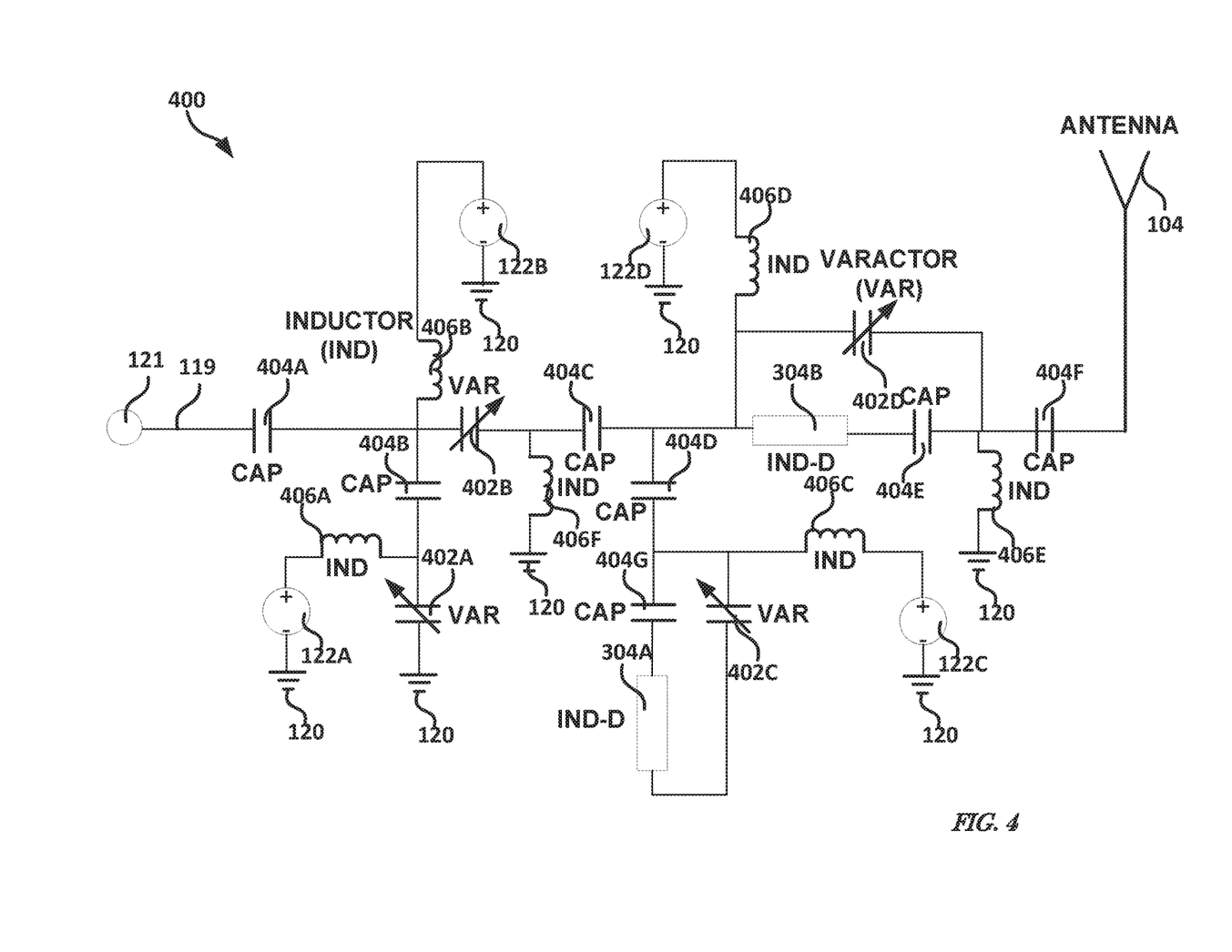
FIG. 4 illustrates, by way of example, a schematic diagram of another embodiment of an impedance matching tuner.

FIG. 4 illustrates, by way of example, a schematic diagram of another embodiment of a system 400 that is a portion of the system 200. Similar to the system 300, the system 400 can adjust a voltage on the control lines 122A-D to realize an impedance in any impedance region in the Smith chart (see FIG. 5). The system 400 as illustrated includes an impedance matching tuner and surrounding components.

The system 400 as illustrated includes a plurality of varactors 402A. 402B, 402C, and 402D, a plurality of capacitors 404A. 404B, 404C, 404D, 404E, 404F, and 404G, a plurality of inductors 406A, 406B. 406C, 406D, 406E, and 406F, the inductance devices 304A-B, the control lines 122A-D (represented as voltage supplies in FIG. 4 so as to indicate that the control lines 122A-D are providing a voltage that adjusts a capacitance value of the varactor 402A-D, respectively). The impedance matching tuner can include the varactors 402A-D, capacitors 404A-G, inductance devices 304A-B, and inductors 406A-F.

The capacitor 404A is connected to an RF input 121 at one end. The capacitor 404A is connected to the inductor 406B, varactor 402B, and the capacitor 404B at another end. The varactor 406B is connected between the control line 122B and ground 120 on one end and the capacitor 404A, the varactor 402B, and the capacitor 404B at another end. The capacitor 404B is connected between the capacitor 404A, the inductor 406B, and the varactor 402B at one end and the inductor 406A and the varactor 402A at another end. The inductor 406A is connected between the control line 122A and ground 120 at one end and the capacitor 404B and the varactor 402A at another end. The varactor 402A is connected between ground 120 on one end and the inductor 406A and the capacitor 404B on another end.

The varactor 402B is connected between the capacitor 404A, the capacitor 404B, and the inductor 406B on one end and the inductor 406F and the capacitor 404C on another end. The inductor 406F is connected between ground on one end and the varactor 402B and the capacitor 404C on another end. The capacitor 404C is connected between the varactor 402B and the inductor 406F on one end and the capacitor 404D, the inductance device 304B, the varactor 402D, and the inductor 406D on another end.

The capacitor 404D is connected between the capacitor 404C, the inductance device 304B, the varactor 402D, and the inductor 406D on one end and the capacitor 404G, the varactor 402C, and the inductor 406C on another end. The capacitor 404G is connected between the capacitor 404D, the inductor 406C, and the varactor 402C on one end and the inductance device 304A on another end. The inductance device 304A is connected between the capacitor 404G and the varactor 402C. The varactor 402C is connected between the inductance device 304A on one end and the capacitor 404G, the inductor 406C, and the capacitor 404D on another end. The inductor 406C is connected between the control line 122C and ground 120 on one end and the varactor 402C, capacitor 404G, and capacitor 404D on the other end.

The inductance device 304B is connected between the capacitor 404D, the capacitor 404C, the inductor 406D, and the varactor 402D on one end and the capacitor 404E on another end. The inductor 406D is connected between the control line 122D and ground 120 on one end and the capacitor 404C, the capacitor 404D, the inductance device 304B, and the varactor 402D on another end. The varactor 402D is connected between the inductor 406D, the inductance device 304B, the capacitor 404C, and the capacitor 404D on one end and the capacitor 404E, the inductor 406E and the capacitor 404F on another end. The capacitor 404E is electrically coupled between the inductance device 304B on one end and the varactor 402D, the capacitor 404F, and the inductor 406E on another end.

The inductor is connected between the capacitor 404E, the varactor 402D, and the capacitor 404F on one end and ground on another end. The capacitor 404F is connected between the antenna 104 on one end and the varactor 402D, the capacitor 404E, and the inductor 406E on another end.

The varactor 402B is in series with the input 121. The varactor 402A (and components connected thereto) are in shunt with the input 121. The varactor 402D and the inductance device 304B are in parallel with each other and in series with the input 121. The varactor 402C and the inductance device 304A are parallel to each other and in shunt with the input 121.

Each of the inductors 406A-D can filter out high frequency content of a signal incident thereon, such as to filter out a transient signal and/or noise. Such a configuration can help keep the capacitance value of the varactor 402A-D more stable and/or keep higher frequency content out of a signal provided to the antenna 104. Each of the capacitors 404A-G can filter out low frequency content of a signal incident thereon, such as to keep lower frequency content out of the signal provided to the antenna.

As previously discussed, the inductance devices 304A-B can be transmission lines (e.g., a length of conductive material, such as copper wire with one end of the conductive material left unconnected) and/or tunable inductors.

Figure 5:
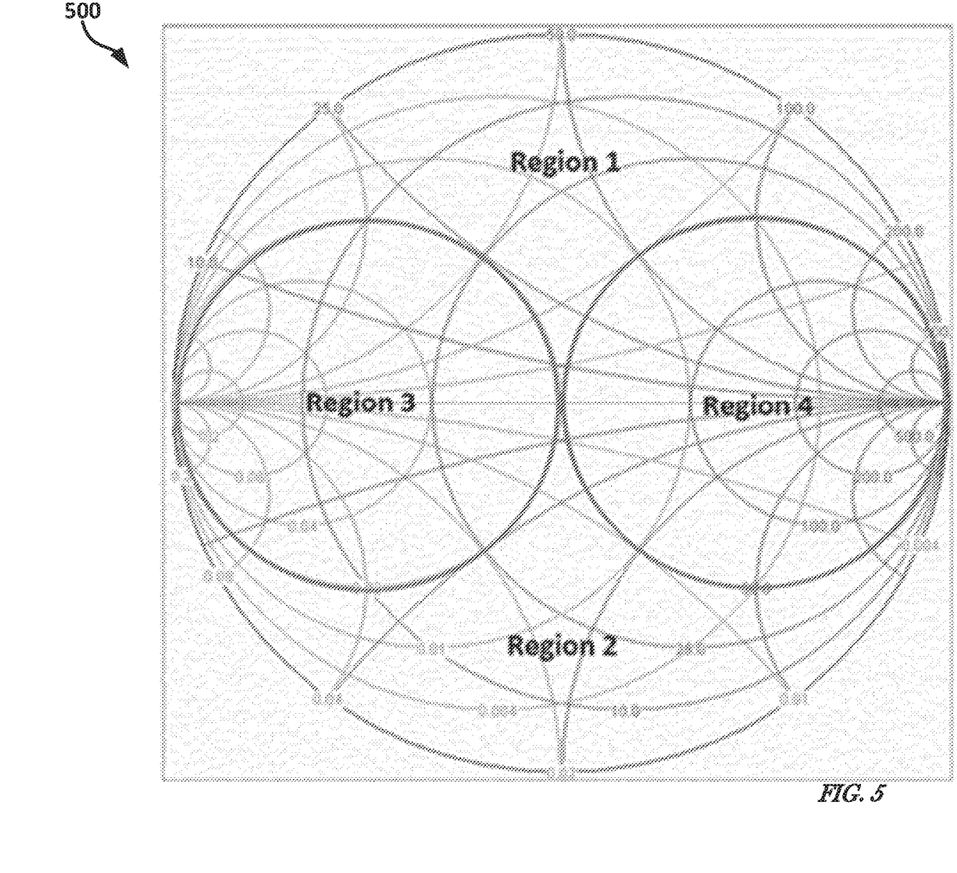
FIG. 5 illustrates, by way of example, a diagram of a Smith chart split into four regions.

FIG. 5 illustrates, by way of example, a diagram of a Smith chart 500 split into four regions. The four regions are labeled as "Region 1", "Region 2". "Region 3", and "Region 4". $\Gamma_{MAG}$ and $\Gamma_{ANGLE}$, the magnitude and angle of a reflection coefficient, can be determined, by the processor 102, based on values provided by the detectors 106 and 107 and/or the ADC 112 and 113. The reflection coefficient includes a ratio of the reflected signal to the forward signal. The detector 106 and/or the ADC 112 can provide magnitude and/or phase values for a forward signal (a signal provided to the antenna 104). The detector 107 and/or the ADC 113 can provide magnitude and/or phase values for a reflected signal (a signal reflected back to the bi-directional coupler 110 from the antenna 104. The $\Gamma_{MAG}$ and $\Gamma_{ANGLE}$ can be determined based on the received forward signal and the received reflected signal. Based on the determined $\Gamma_{MAG}$ and $\Gamma_{ANGLE}$, the processor 102 can determine what values the tuning capacitors 302A-D or 402A-D and/or inductance devices 304A-B should be set to, such as to best match the impedance of the antenna 104 (best in terms of resources available including resolution of the capacitors 302A-D and 402A-D and/or inductance devices 304A-B).

For example, consider the system 300 and the Smith chart 500. If the processor 102 determines, based on $\Gamma_{MAG}$ and $\Gamma_{ANGLE}$, that the reflected signal lies in the Region 1 on the Smith chart 500, the processor 102 can set the values on the control lines 122A and 122B to appropriate values or voltages to compensate for the impedance mismatch, set the value on the control line 122C to a maximum value or voltage (maximum for the given tunable capacitor 302A-D), and set the value on the control line 122D to a minimum value or voltage (minimum for the given tunable capacitor 302A-D). If the processor 102 determines, based on $\Gamma_{MAG}$ and $\Gamma_{ANGLE}$, that the reflected signal lies in the Region 2 on the Smith chart 500, the processor 102 can set the values on the control lines 122C and 122D to appropriate values or voltages to compensate for the impedance mismatch, set the value on the control line 122A to a maximum value or voltage, and set the value on the control line 122B to a minimum value or voltage. If the processor 102 determines, based on $\Gamma_{MAG}$ and $\Gamma_{ANGLE}$, that the reflected signal lies in the Region 3 on the Smith chart 500, the processor 102 can set the values on the control lines 122A and 122D to appropriate values or voltages to compensate for the impedance mismatch, set the value on the control line 122C to a maximum value or voltage, and set the value on the control line 122B to a minimum value or voltage. If the processor 102 determines, based on $\Gamma_{MAG}$ and $\Gamma_{ANGLE}$, that the reflected signal lies in the Region 4 on the Smith chart 500, the processor 102 can set the values on the control lines 122B and 122C to appropriate values or voltages to compensate for the impedance mismatch, set the value on the control line 122A to a maximum value or voltage, and set the value on the control line 122D to a minimum value or voltage. The appropriate values for the tunable capacitors can be determined by looking up the values in look up table, or by performing operations of a function that governs the appropriate values for the tunable capacitors.

Figure 6:
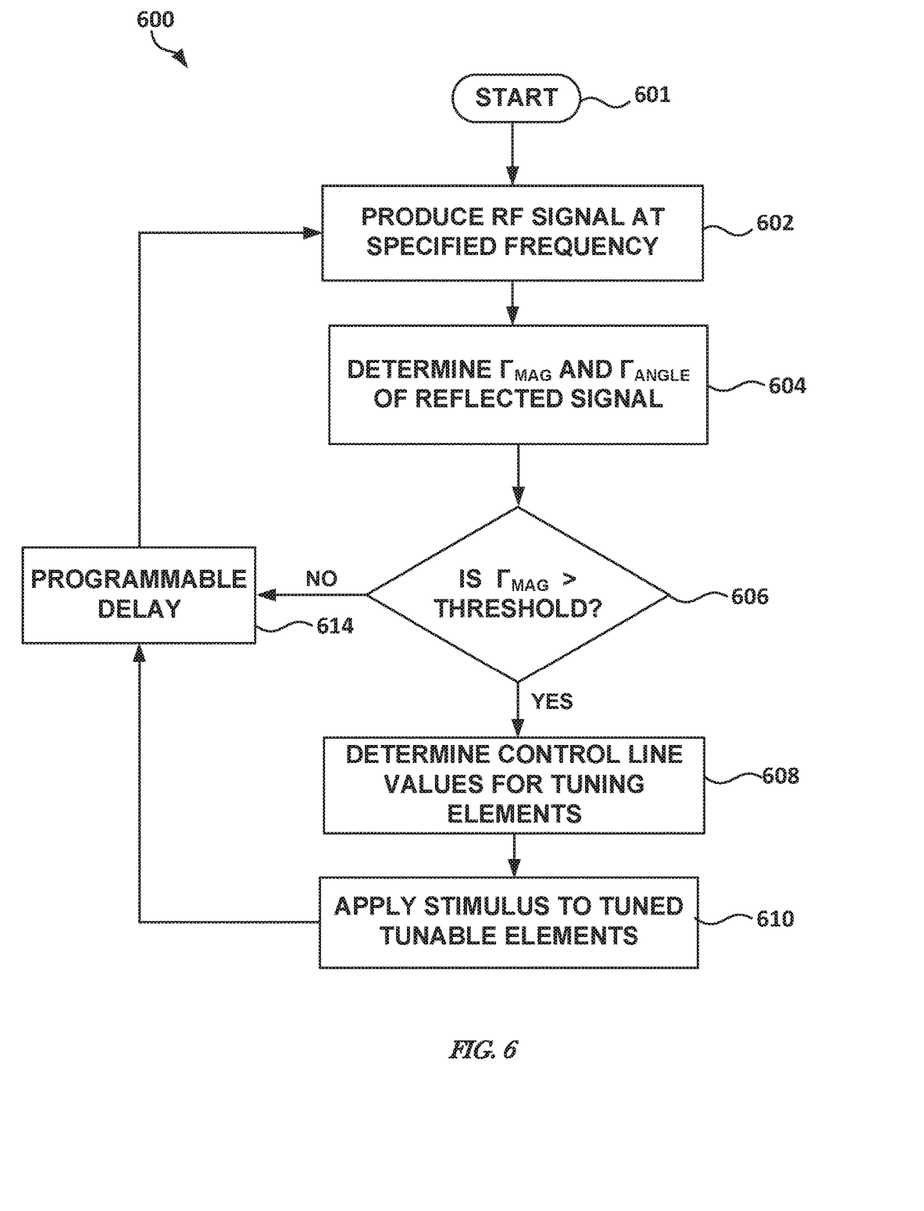
FIG. 6 illustrates, by way of example, a flow diagram of an embodiment of a method.

FIG. 6 illustrates, by way of example, a flow diagram of an embodiment of a method 600. The method 600 can be carried out by the processor 102 and/or one or more components of a machine 700 (see FIG. 7). The method 600 begins at operation 601. At operation 602, an RF pulse can be produced at a specified frequency. At operation 604, a magnitude and angle of a reflection coefficient, Γ, can be determined. The magnitude and angle of a reflection coefficient can be determined for the produced RF signal. At operation 606, it can be determined whether the magnitude of the reflection coefficient is greater than (or equal to) a threshold. If the magnitude of the reflection coefficient is not greater than the specified threshold value, then the method 600 can continue at operation 614. If the magnitude of the reflection coefficient is greater than the specified threshold value, then the method 600 can continue at operation 608.

At the operation 608, values or voltages for each of the control lines 122A-D can be determined based on the magnitude and angle of the reflection coefficient. As previously discussed, the values or voltages of the control lines 122A-D can determine a capacitance and/or inductance value of tunable elements (e.g., the tunable capacitors and/or inductors of the impedance matching tuner). At operation 610, stimulus can be applied to tunable elements of the impedance matching tuner (e.g., the tuner 108), such as by applying the determined control line values or voltages to the control lines 122A-D. At operation 614, a specified time delay (e.g., a specified number of clock cycles) can be started and passed, such as before the method 600 repeats at operation 602.

Figure 7:
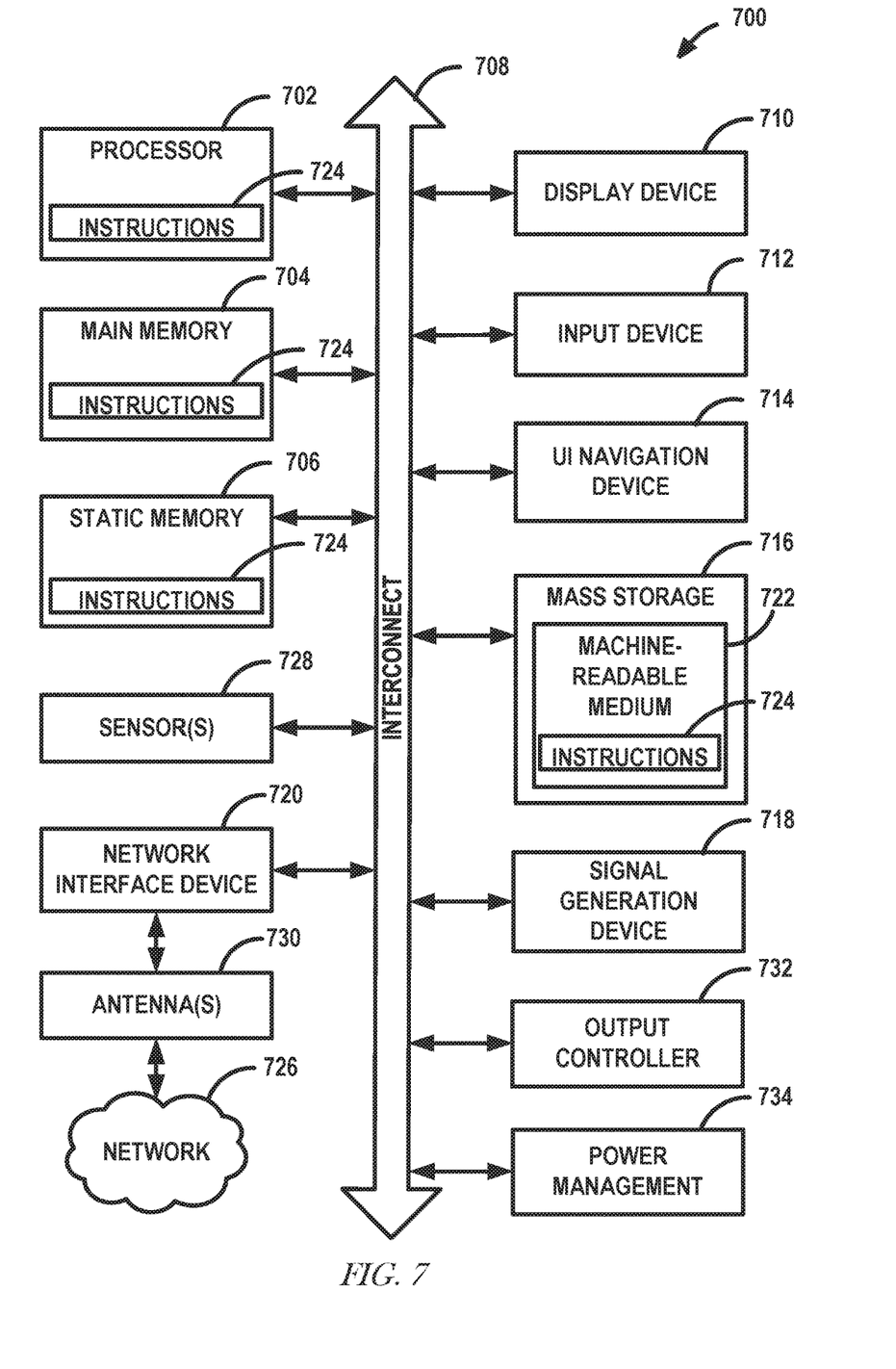
FIG. 7 illustrates, by way of example, a block diagram of an embodiment of a computing device system.

FIG. 7 illustrates, by way of example, a block diagram of an embodiment of a computing machine 700. Using one or more components of the machine 700, one or more of the methods herein discussed can be run. In one or more embodiments, the processor 102, detector 106, detector 107, or the system 100, 200, 300, and/or 400 can include one or more items of the machine 700. The machine 700 can be embodied as a computing device, providing operations of the processor 102 or any other processing or computing platform or component described or referred to herein. In alternative embodiments, the machine operates as a stand-alone device or can be connected (e.g., networked) to other machines. In a networked deployment, the machine can operate in the capacity of either a server or a client machine in server-client network environments, or it can act as a peer machine in peer-to-peer (or distributed) network environments. The computer system machine can be a personal computer (PC), such as a PC that can be portable (e.g., a notebook or a netbook) or a PC that is not conveniently portable (e.g., a desktop PC), a tablet, a set-top box (STB), a gaming console, a Personal Digital Assistant (PDA), a mobile telephone or Smartphone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Implementing techniques using computer processors and other logic can lead to automated camera condition change detection (e.g., that does not include human interference).

Example machine 700 can include a processor 702 (e.g., a central processing unit (CPU), a graphics processing unit (GPU) or both), a main memory 704 and a static memory 706, which communicate with each other via an interconnect 708 (e.g., a link, a bus, etc.). The machine 700 can further include a video display unit 710, an alphanumeric input device 712 (e.g., a keyboard), and a user interface (UI) navigation device 714 (e.g., a mouse). In one embodiment, the video display unit 710, input device 712 and UI navigation device 714 are a touch screen display. The machine 700 can additionally include a storage device 716 (e.g., a drive unit), a signal generation device 718 (e.g., a speaker), an output controller 732, a power management controller 734, or a network interface device 720 (which can include or operably communicate with one or more antennas 730, transceivers, or other wireless communications hardware), or one or more sensors 728, such as a GPS sensor, compass, location sensor, accelerometer, or other sensor.

The storage device 716 includes a machine-readable medium 722 on which is stored one or more sets of data structures and instructions 724 (e.g., software) embodying or utilized by any one or more of the methodologies or functions described herein. The instructions 724 can also reside, completely or at least partially, within the main memory 704, static memory 706, and/or within the processor 702 during execution thereof by the machine 700, with the main memory 704, static memory 706, or the processor 702 also constituting machine-readable media. The processor 702 configured to perform an operation can include configuring instructions of a memory or other machine-readable media coupled to the processor, which when executed by the processor, cause the processor 702 to perform the operation.

While the machine-readable medium 722 is illustrated in an example embodiment to be a single medium, the term "machine-readable medium" can include a single medium or multiple media (e.g., a centralized or distributed database, and/or associated caches and servers) that store the one or more instructions 724. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, optical media, and magnetic media. Specific examples of machine-readable media include non-volatile memory, including, by way of example, semiconductor memory devices (e.g., Electrically Programmable Read-Only Memory (EPROM), Electrically Erasable Programmable Read-Only Memory (EEPROM)) and flash memory devices; magnetic disks such as internal hard disks and removable disks; magneto-optical disks; and CD-ROM and DVD-ROM disks.

The instructions 724 can further be transmitted or received over a communications network 726 using a transmission medium via the network interface device 720 utilizing any one of a number of well-known transfer protocols (e.g., HTTP). Examples of communication networks include a local area network (LAN), wide area network (WAN), the Internet, mobile telephone networks, Plain Old Telephone (POTS) networks, and wireless data networks (e.g., Wi-Fi, 3G, and 4G LTE/LTE-A or WiMAX networks). The term "transmission medium" shall be taken to include any intangible medium that is capable of storing, encoding, or carrying instructions for execution by the machine, and includes digital or analog communications signals or other intangible medium to facilitate communication of such software.

ADDITIONAL NOTES AND EXAMPLES

The present subject matter can be described by way of several examples.

Example 1 can include or use subject matter (such as an apparatus, a method, a means for performing acts, or a device readable memory including instructions that, when performed by the device, can cause the device to perform acts), such as can include or use an impedance matching tuner comprising a first tunable capacitor arranged in series with a radio frequency (RF) input, a second tunable capacitor arranged in shunt with the RF input, a third tunable capacitor and a first inductance device arranged in parallel with each other and in shunt with the RF input, and a fourth tunable capacitor and a second inductance device arranged in parallel with each other and in series with the RF input.

Example 2 can include or use, or can optionally be combined with the subject matter of Example 1, to include or use, wherein the first, second, third, and fourth tunable capacitors are digitally tunable capacitors and the first and second inductance devices are transmission lines.

Example 3 can include or use, or can optionally be combined with the subject matter of at least one of Examples 1-2, to include or use, wherein the first, second, third, and fourth tunable capacitors are digitally tunable capacitors and the first and second inductance devices are tunable inductors.

Example 4 can include or use, or can optionally be combined with the subject matter of at least one of Examples 1-3, to include or use, wherein the first, second, third, and fourth tunable capacitors are varactors and the first and second inductance devices are transmission lines or tunable inductors.

Example 5 can include or use, or can optionally be combined with the subject matter of Example 4, to include or use a first inductor arranged to filter out high frequency content of a signal incident on the first tunable capacitor.

Example 6 can include or use, or can optionally be combined with the subject matter of Example 5, to include or use a second inductor arranged to filter out high frequency content of a signal incident on the second tunable capacitor.

Example 7 can include or use, or can optionally be combined with the subject matter of Example 6, to include or use a third inductor arranged to filter out high frequency content of a signal incident on the third tunable capacitor.

Example 8 can include or use, or can optionally be combined with the subject matter of Example 6, to include or use a fourth inductor arranged to filter out high frequency content of a signal incident on the fourth tunable capacitor.

Example 9 can include or use subject matter (such as an apparatus, a method, a means for performing acts, or a device readable memory including instructions that, when performed by the device, can cause the device to perform acts), such as can include or use a system including an antenna, a hardware processor electrically coupled to the antenna, a first amplitude and phase detector electrically coupled between the antenna and the processor to receive at least a portion of a forward signal provided to the antenna and determine an amplitude and phase of the forward signal, a second amplitude and phase detector electrically coupled between the antenna and the processor to receive at least a portion of a reflected signal from the antenna and determine an amplitude and phase of the reflected signal the reflected signal is a portion of the forward signal, and an impedance matching tuner electrically connected between the antenna and the first and second detectors, the impedance matching tuner including one or more tunable capacitors and one or more inductance devices, the one or more tunable capacitors having capacitances that are set by the hardware processor based on the amplitudes and phases determined by the first and second amplitude and phase detectors.

Example 10 can include or use, or can optionally be combined with the subject matter of Example 9, to include or use a bi-directional coupler electrically coupled between the antenna and the first and second amplitude and phase detectors, wherein the bi-directional coupler includes a plurality of paths including a first path that provides a path for a majority of the forward and reflected signals to pass therethrough a second path that provides a path for the remainder of the forward signal to pass therethrough to the first amplitude and phase detector, and a third path that provides a path for a remainder of the reflected signal to pass therethrough to the second amplitude and phase detector.

Example 11 can include or use, or can optionally be combined with the subject matter of at least one of Examples 9-10, to include or use, wherein the impedance matching tuner includes a first tunable capacitor arranged in series with a radio frequency (RF) input signal, a second tunable capacitor arranged in shunt with the RF input, a third tunable capacitor and a first inductance device arranged in parallel with each other and in shunt with the RF input, and a fourth tunable capacitor and a second inductance device arranged in parallel with each other in series with the RF input.

Example 12 can include or use, or can optionally be combined with the subject matter of at least one of Examples 9-10, to include or use wherein the processor is programmed to determine, based on the amplitudes and phases from the first and second amplitude and phase detectors, a capacitance value to which to set the first, second, third, and fourth tunable capacitors, and provide a voltage or value to the first, second, third, and fourth tunable capacitors, respectively, to set the first, second, third, and fourth tunable capacitors to the determined capacitance value.

Example 13 can include or use, or can optionally be combined with the subject matter of Example 12, to include or use, wherein the processor is programmed to determine, based on the amplitudes and phases from the first and second amplitude and phase detectors, a magnitude of a reflection coefficient associated with the reflected signal, compare the determined magnitude of the reflection coefficient to a specified threshold, and determine, based on the comparison, whether to adjust the voltage or value provided to the first, second, third, and fourth tunable capacitors.

Example 14 can include or use, or can optionally be combined with the subject matter of Example 13, to include or use, wherein the determination of whether to adjust the voltage or value includes adjusting the voltage or value in response to determining the magnitude of the reflection coefficient is greater than the threshold.

Example 15 can include or use, or can optionally be combined with the subject matter of at least one of Examples 13-14, to include or use, wherein the determination of whether to adjust the voltage or value includes waiting a programmed amount of time in response to determining the magnitude of the reflection coefficient is less than the threshold.

Example 16 can include or use, or can optionally be combined with the subject matter of at least one of Examples 9-15, to include or use, wherein the system further comprises a first analog to digital converter to receive the determined amplitude and phase from the first amplitude and phase detector and convert the determined amplitude and phase to a digital word, and a second analog to digital converter to receive the determined amplitude and phase from the second amplitude and phase detector and convert the determined amplitude and phase to a digital word.

Example 17 can include or use subject matter (such as an apparatus, a method, a means for performing acts, or a device readable memory including instructions that, when performed by the device, can cause the device to perform acts), such as can include or use providing, by processing circuitry, a radio frequency (RF) input signal to an output of a first device, receiving, by a first path of bi-directional coupler coupled between the output and the processing circuitry, a first portion of the RF input signal, receiving, by a second path of the bi-directional coupler, a second portion of the RF input signal reflected from the output, determining, by a first amplitude and phase detector coupled between the processing circuitry and the bi-directional coupler, a magnitude and angle of the first portion of the RF input signal, determining, by a second amplitude and phase detector coupled between the processing circuitry and the bi-directional coupler, a magnitude and angle of the second portion of the RF input signal, determining, by the processing circuitry, a magnitude and angle of a reflection coefficient associated with the RF signal reflected from the output, and providing, by the processing circuitry, respective voltages or values to each of a plurality of tunable capacitors of an impedance matching tuner coupled between the bi-directional coupler and the output, the respective voltages or values determined based on the determined magnitude and angle of the reflection coefficient.

Example 18 can include or use, or can optionally be combined with the subject matter of Example 17, to include or use, wherein the impedance matching tuner includes a first tunable capacitor arranged in series with a radio frequency (RF) input signal, a second tunable capacitor arranged in shunt with the RF input, a third tunable capacitor and a first inductance device arranged in parallel with each other and in shunt with the RF input, and a fourth tunable capacitor and a second inductance device arranged in parallel with each other in series with the RF input, and wherein the respective voltages or values include a voltage or value for each of the first, second, third, and fourth tunable capacitors.

Example 19 can include or use, or can optionally be combined with the subject matter of Example 18, to include or use, wherein the first, second, third, and fourth tunable capacitors are digitally tunable capacitors and wherein the voltages or values are digital words.

Example 20 can include or use, or can optionally be combined with the subject matter of at least one of Examples 18-19, to include or use, wherein the first, second, third, and fourth tunable capacitors are varactors and wherein the voltages or values are voltages.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B." "B but not A." and "A and B." unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in this document, the terms "first," "second," and "third," etc. are used merely as labels, and are not intended to impose numerical requirements on their objects.

From the foregoing, it will be observed that numerous variations and modifications can be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

Although a few embodiments have been described in detail above, other modifications are possible. For example, the logic flows depicted in the FIGS. do not require the particular order shown, or sequential order, to achieve desirable results. Other steps can be provided, or steps can be eliminated, from the described flows, and other components can be added to, or removed from, the described systems. Other embodiments can be within the scope of the following claims.

The invention claimed is:

1. An impedance matching tuner comprising:
a first tunable capacitor arranged in series with a radio frequency (RF) input;
a first control line to carry a first tuning signal from a processor to the first tunable capacitor;
a first inductor electrically coupled between the first tunable capacitor and the first control line;
a second tunable capacitor arranged in shunt with the RF input;
a second control line to carry a second tuning signal from the processor to the second tunable capacitor;
a second inductor electrically coupled between the second tunable capacitor and the second control line;
a third tunable capacitor and a first inductance device arranged in parallel with each other and in shunt with the RF input;
a third control line to carry a third tuning signal from the processor to the third tunable capacitor;
a third inductor electrically coupled between the third tunable capacitor and the second control line;
a fourth tunable capacitor and a second inductance device arranged in parallel with each other and in series with the RF input;
a fourth control line to carry a fourth tuning signal from the processor to the fourth tunable capacitor; and
a fourth inductor electrically coupled between the fourth tunable capacitor and the fourth control line, wherein the first, second, third, and fourth inductors are in shunt with the RF input.

2. The impedance matching tuner of claim 1, wherein the first, second, third, and fourth tunable capacitors are digitally tunable capacitors and the first and second inductance devices are transmission lines.

3. The impedance matching tuner of claim 1, wherein the first, second, third, and fourth tunable capacitors are digitally tunable capacitors and the first and second inductance devices are tunable inductors.

4. The impedance matching tuner of claim 1, wherein the first, second, third, and fourth tunable capacitors are varactors and the first and second inductance devices are transmission lines or tunable inductors.

5. A system comprising:
an antenna;
a hardware processor electrically coupled to the antenna;
a first amplitude and phase detector electrically coupled between the antenna and the processor to receive at least a portion of a forward signal provided to the antenna and determine an amplitude and phase of the forward signal;
a second amplitude and phase detector electrically coupled between the antenna and the processor to receive at least a portion of a reflected signal from the antenna and determine an amplitude and phase of the reflected signal, the reflected signal is a portion of the forward signal; and
an impedance matching tuner electrically connected between the antenna and the first and second detectors, the impedance matching tuner including tunable capacitors having capacitances that are set by the hardware processor based on the amplitudes and phases determined by the first and second amplitude and phase detectors, the one or more tunable capacitors comprising, first, second, third and fourth tunable capacitors, the first tunable capacitor arranged in series with the forward signal, a first control line to carry a first tuning signal from a processor to the first tunable capacitor, a first inductor electrically coupled between the first tunable capacitor and the first control line; the second tunable capacitor arranged in shunt with the forward signal, a second control line to carry a second tuning signal from the processor to the second tunable capacitor, a second inductor electrically coupled between the second tunable capacitor and the second control line, a third tunable capacitor and a first inductance device arranged in parallel with each other and in shunt with the forward signal, a third control line to carry a third tuning signal from the processor to the third tunable capacitor, a third inductor electrically coupled between the third tunable capacitor and the second control line, the fourth tunable capacitor and a second inductance device arranged in parallel with each other and in series with the forward signal; a fourth control line to carry a fourth tuning signal from the processor to the fourth tunable capacitor; and a fourth inductor electrically coupled between the fourth tunable capacitor and the fourth control line.

6. The system of claim 5, further comprising a bi-directional coupler electrically coupled between the antenna and the first and second amplitude and phase detectors, wherein the bi-directional coupler includes a plurality of paths including a first path that provides a path for a majority of the forward and reflected signals to pass therethrough a second path that provides a path for the remainder of the forward signal to pass therethrough to the first amplitude and phase detector, and a third path that provides a path for a remainder of the reflected signal to pass therethrough to the second amplitude and phase detector.

7. The system of claim 5, wherein the impedance matching tuner includes:
a first tunable capacitor arranged in series with a radio frequency (RF) input signal;
a second tunable capacitor arranged in shunt with the RF input;
a third tunable capacitor and a first inductance device arranged in parallel with each other and in shunt with the RF input; and
a fourth tunable capacitor and a second inductance device arranged in parallel with each other in series with the RF input.

8. The system of claim 7, wherein:
the processor is programmed to:
determine, based on the amplitudes and phases from the first and second amplitude and phase detectors, a capacitance value to which to set the first, second, third, and fourth tunable capacitors; and
provide a voltage or value to the first, second, third, and fourth tunable capacitors, respectively, to set the first, second, third, and fourth tunable capacitors to the determined capacitance value.

9. The system of claim 8, wherein:
the processor is programmed to:
determine, based on the amplitudes and phases from the first and second amplitude and phase detectors, a magnitude of a reflection coefficient associated with the reflected signal;
compare the determined magnitude of the reflection coefficient to a specified threshold; and
determine, based on the comparison, whether to adjust the voltage or value provided to the first, second, third, and fourth tunable capacitors.

10. The system of claim 9, wherein the determination of whether to adjust the voltage or value includes adjusting the voltage or value in response to determining the magnitude of the reflection coefficient is greater than the threshold.

11. The system of claim 9, wherein the determination of whether to adjust the voltage or value includes waiting a programmed amount of time in response to determining the magnitude of the reflection coefficient is less than the threshold.

12. The system of claim 5, wherein the system further comprises:
a first analog to digital converter to receive the determined amplitude and phase from the first amplitude and phase detector and convert the determined amplitude and phase to a digital word; and
a second analog to digital converter to receive the determined amplitude and phase from the second amplitude and phase detector and convert the determined amplitude and phase to a digital word.

13. A method comprising:
providing, by processing circuitry, a radio frequency (RF) input signal to an output of a first device;
receiving, by a first path of bi-directional coupler coupled between the output and the processing circuitry, a first portion of the RF input signal;
receiving, by a second path of the bi-directional coupler, a second portion of the RF input signal reflected from the output;
determining, by a first amplitude and phase detector coupled between the processing circuitry and the bi-directional coupler, a magnitude and angle of the first portion of the RF input signal;
determining, by a second amplitude and phase detector coupled between the processing circuitry and the bi-directional coupler, a magnitude and angle of the second portion of the RF input signal;
determining, by the processing circuitry, a magnitude and angle of a reflection coefficient associated with the RF signal reflected from the output; and
providing, by the processing circuitry, respective voltages or values to each of a first, second, third, and fourth tunable capacitors of an impedance matching tuner coupled between the bi-directional coupler and the output, the respective voltages or values determined based on the determined magnitude and angle of the reflection coefficient,
wherein the impedance matching tuner includes:
the first tunable capacitor arranged in series with a radio frequency (RF) input signal;
a first control line to carry a first tuning signal from a processor to the first tunable capacitor;
a first inductor electrically coupled between the first tunable capacitor and the first control line;
the second tunable capacitor arranged in shunt with the RF input;
a second control line to carry a second tuning signal from the processor to the second tunable capacitor;
a second inductor electrically coupled between the second tunable capacitor and the second control line;
the third tunable capacitor and a first inductance device arranged in parallel with each other and in shunt with the RF input;
a third control line to carry a third tuning signal from the processor to the third tunable capacitor;
a third inductor electrically coupled between the third tunable capacitor and the second control line;
the fourth tunable capacitor and a second inductance device arranged in parallel with each other in series with the RF input;
a fourth control line to carry a fourth tuning signal from the processor to the fourth tunable capacitor;
a fourth inductor electrically coupled between the fourth tunable capacitor and the fourth control line; and
wherein the respective voltages or values include a voltage or value for each of the first, second, third, and fourth tunable capacitors.

14. The method of claim 13, wherein the first, second, third, and fourth tunable capacitors are digitally tunable capacitors and wherein the voltages or values are digital words.

15. The method of claim 13, wherein the first, second, third, and fourth tunable capacitors are varactors and wherein the voltages or values are voltages.

* * * * *